US007843113B2

(12) United States Patent
Wijngaards et al.

(10) Patent No.: US 7,843,113 B2
(45) Date of Patent: Nov. 30, 2010

(54) INK JET DEVICE HAVING PIEZOELECTRIC ACTUATOR WITH INSULATING STRUCTURE AND METHOD OF PRODUCING THE PIEZOELECTRIC ACTUATOR

(75) Inventors: David D. L. Wijngaards, Tegelen (NL); Hans Reinten, Velden (NL); Hendrik J. Stolk, Bergen (NL); Alex N. Westland, Baarlo (NL)

(73) Assignee: OCE-Technologies B.V., Venlo (NL)

( * ) Notice: Subject to any disclaimer, the term of this patent is extended or adjusted under 35 U.S.C. 154(b) by 50 days.

(21) Appl. No.: 12/153,966

(22) Filed: May 28, 2008

(65) Prior Publication Data

US 2008/0297006 A1 Dec. 4, 2008

(30) Foreign Application Priority Data

May 30, 2007 (EP) .................................... 7109197

(51) Int. Cl.
*H01L 41/09* (2006.01)
*B41J 2/16* (2006.01)

(52) U.S. Cl. ....................... 310/320; 310/324; 310/365; 347/68; 347/70

(58) Field of Classification Search ................. 310/320, 310/324, 365; 347/68–72
See application file for complete search history.

(56) References Cited

U.S. PATENT DOCUMENTS

| | | | | |
|---|---|---|---|---|
| 6,315,400 | B1 * | 11/2001 | Sakai et al. | 347/70 |
| 2004/0051763 | A1 | 3/2004 | Matsubara et al. | |
| 2005/0046678 | A1 | 3/2005 | Owaki et al. | |
| 2005/0248232 | A1 * | 11/2005 | Itaya et al. | 310/320 |
| 2005/0275316 | A1 | 12/2005 | Murata | |
| 2006/0125489 | A1 * | 6/2006 | Feucht et al. | 324/633 |

FOREIGN PATENT DOCUMENTS

EP 1089360 A1 4/2001

* cited by examiner

*Primary Examiner*—J. SanMartin
(74) *Attorney, Agent, or Firm*—Birch, Stewart, Kolasch & Birch, LLP

(57) ABSTRACT

A piezoelectric actuator having a bottom electrode attached to a membrane, a piezoelectric layer on the bottom electrode, and a top electrode formed on the piezoelectric layer, wherein the bottom electrode extends substantially over the entire bottom surface of the piezoelectric layer, and at least a peripheral portion of a top surface of the piezoelectric layer and side faces of that layer are covered with an insulating layer, and wherein in the peripheral portion of the top surface of the piezoelectric layer the top electrode is superposed on the insulating layer.

19 Claims, 6 Drawing Sheets

INK JET DEVICE HAVING PIEZOELECTRIC ACTUATOR WITH INSULATING STRUCTURE AND METHOD OF PRODUCING THE PIEZOELECTRIC ACTUATOR

This non-provisional application claims priority under 35 U.S.C. §119(a) on European Patent Application No. 07109197.9 filed in the European Patent Office on May 30, 2007, which is herein incorporated by reference

BACKGROUND OF THE INVENTION

The present invention relates to a piezoelectric actuator having a bottom electrode attached to a membrane, a thin piezoelectric layer disposed on the bottom electrode, and a top electrode formed on the piezoelectric layer, wherein the bottom electrode extends over the entire bottom surface of the piezoelectric layer, and at least a peripheral portion of a top surface of the piezoelectric layer arid side faces of that layer are covered with an insulating layer. The present invention also relates to a method of producing such an actuator.

More particularly, the present invention relates to a piezoelectric actuator in an ink jet device that is used in an ink jet printer for expelling an ink droplet in response to an electrical signal energizing the piezoelectric actuator. The actuator, when energized, causes the membrane to flex into a pressure chamber, so that the pressure of liquid ink contained in that chamber is increased and an ink droplet is ejected from a nozzle that communicates with the pressure chamber.

The actuator is operated in a flexural deformation mode. This means, that, when a voltage is applied between the top and bottom electrodes, the piezoelectric layer bends in the direction normal to the plane of the layer and thereby causes the membrane to flex in the same direction. As a consequence, the piezoelectric layer must be thin, in the sense that the thickness of the layer is smaller than at least one dimension of that layer in the plane that is parallel to the plane of the membrane surface.

US 2005/275316 A1 and US 2004/051763 disclose actuators of this type, wherein the bottom electrode is formed as a continuous layer on the membrane, which layer extends beyond the edge of the piezoelectric layer. The insulating layer is formed directly on the top surfaces of the piezoelectric layer and the bottom electrode for separating the bottom electrode from an electrically conductive lead that contacts the top electrode from above, through a hole in the insulating layer.

US 2005/0046678 A1 discloses an actuator, wherein the piezoelectric layer extends beyond the edge of the bottom electrode on at least one side where an electrical contact is applied to the top electrode. This configuration assures a certain distance between the bottom electrode and the conductor that contacts the top electrode, and thus prevents the electrodes from being short-circuited inadvertently.

SUMMARY OF THE INVENTION

It is an object of the present invention to provide a piezoelectric actuator which can be produced reliably and with a high yield and has an improved power gain.

In order to achieve this object, the actuator of the type mentioned in the opening paragraph is characterised in that in the peripheral portion of the top surface of the piezoelectric layer, the top electrode is superposed on the insulating layer. In an embodiment of the present invention, a surrounding portion on the membrane is also covered with an insulating layer The power of and volume displaced by the actuator are determined by the area of the piezoelectric layer that is exposed to the electric field developed between the top and bottom electrodes. Since, according to the present invention, the bottom electrode extends at least up to the peripheral edge of the piezoelectric layer on all sides of the actuator, the actuator volume that is exposed to the electric field, and hence the power that is supplied, is increased significantly.

However, when, for example, sputtering or vapour deposition techniques are used within the framework of MEMS-MST technology (Micro Electro-Mechanical Systems/Micro-Systems-Technologies) for forming the top electrode and electrically contacting the same, the problem of possible short-circuits between the bottom and top electrodes has to be dealt with.

In principle, when the bottom electrode of the actuator is attached to the membrane by means of an adhesive, such short circuits can be prevented by the presence of a meniscus of the adhesive that will be squeezed out between the actuator and the membrane and forms a collar around the peripheral edge of the bottom electrode.

Nevertheless, the reliability and yield of the production process may be degraded by the following effect: When the top electrode is formed, e.g. by sputtering or vapour deposition, to extend over a lateral surface of the piezoelectric layer and then over the surface of the membrane in order to provide an electrical contact for the top electrode, the extended portion of the top electrode and the peripheral edge of the bottom electrode will be separated only by the meniscus of the adhesive. Due to variations in the bond process, the distance between the electrodes may become very small. Hence, when a voltage is applied, a very strong electrical field will develop in the edge portion of the piezoelectric layer, and this may cause electrical damage to the piezoelectric material or the electrodes. Moreover, even if a collar is formed, such collar may be discontinuous so that the electrodes come into direct contact, causing a short circuit.

In order to avoid these effects, according to the present invention, at least the peripheral edge portion of the top surface of the piezoelectric layer and the side faces of the piezoelectric layer are covered and thus protected by an insulating layer. A surrounding portion on the membrane may also be covered with the same insulating layer. Thus, when the top electrode is applied on the piezoelectric layer, it will superimpose on the insulating layer, and on the side where the top electrode is led out onto the membrane surface. The insulating layer will provide a sufficient distance between the top and bottom electrodes and will thus prevent or at least limit the aforementioned failure mechanisms.

The thickness of the insulating layer can easily be controlled so as to safely prevent not only short-circuits but also electrical damage to the piezoelectric layer. Thus, the actuator according to the present invention provides, on the one hand, a high actuating force for a given size of the actuator and a given energizing voltage, and, on the other hand, permits an efficient and reliable production process with high yield, without any risk of short circuits or damage to the piezo.

A suitable method for manufacturing the actuator is specified in the independent method claims. In one embodiment, the insulating layer may have a uniform thickness on all the surface areas of the piezoelectric layer and the membrane where it is applied. In a modified embodiment, however, the thickness of the insulating layer may be non-uniform. Preferably, the insulating layer has a higher thickness in those portions covering the membrane surface than in the portions covering the top surface of the piezoelectric layer. This has the advantage that the minimum distance between the top and bottom electrodes may be established by suitably controlling the thickness of the insulating layer on the membrane, while the relatively small thickness of the insulating layer on the top surface of the piezoelectric layer facilitates the formation of electrical contacts and minimizes the distance between the peripheral edge portion of the top electrode and the piezoelectric layer and thus minimizes distortions of the electrical field near the edge of the actuator.

In a specific embodiment, it is even possible that the piezoelectric layer and the surrounding part of the membrane are completely buried in the insulating layer, so that the insulating layer will have a flat top surface with only a window formed therein for exposing the top surface of the piezoelectric layer to the top electrode. Then, the flat top surface of the insulating layer may be used as a carrier for electrical conductors which will then be essentially level with the top electrode, so that the top electrode may be contacted more easily. When buried sufficiently deep in the insulating layer, the window formed in the insulating layer may accommodate the actuator with sufficient play so as not to obstruct the piezoelectric deformation of the actuator.

Preferably, the insulating layer is formed by a photo-curable resin such as SU8 or BCB. The insulating layer may in this case be formed, e.g. by spin coating or spray coating, as a continuous layer that initially covers the entire top surface of the piezoelectric layer. Then, those portions of the insulating layer which are to be retained for insulating purposes are exposed by the light in order to cure the resin, whereas the resin in the other parts of the layer is removed, so as to expose the top surface of the piezoelectric layer and other areas, e.g. on the membrane, where the insulating layer is not wanted.

The manufacturing techniques described above, are particularly well suited for efficiently producing an array of a plurality of actuators integrated with high integration density on a common chip. Thus, it is possible to obtain an ink jet device with a high nozzle density for high resolution and high speed printing.

BRIEF DESCRIPTION OF THE DRAWINGS

Preferred embodiments of the present invention will now be described in conjunction with the drawings, wherein.

DETAILED DESCRIPTION OF THE INVENTION

Figure 1:
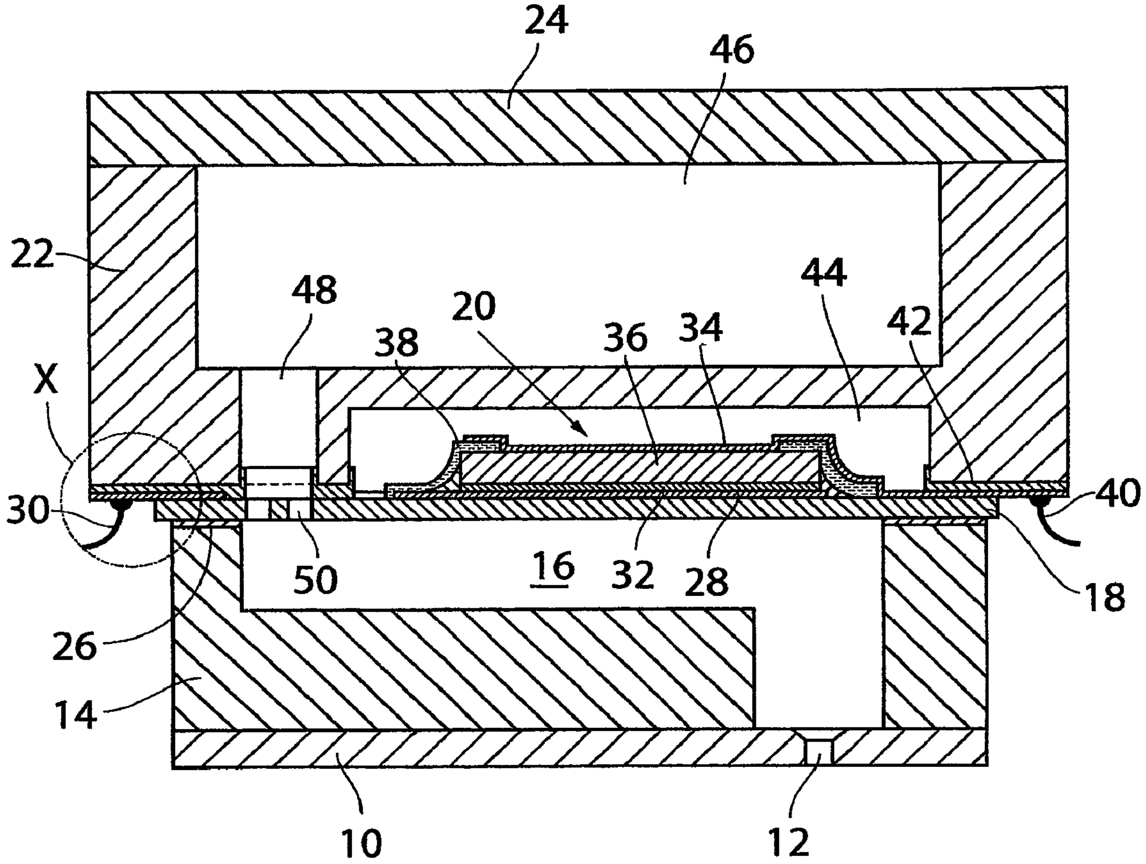
FIG. 1 is a cross-sectional view of an individual ink jet device manufactured by the method according to the present invention.

As is shown in FIG. 1, an ink jet device according to the present invention has a layered structure comprising, from the bottom to the top in FIG. 1, a nozzle plate 10 with a nozzle 12 formed therein, a chamber plate 14 defining a pressure chamber 16 that communicates with the nozzle 12, a flexible membrane 18 carrying a piezoelectric actuator 20, a distribution plate 22 for supplying liquid ink to the pressure chamber 16, and an optional cover plate 24.

The chamber plate 14, the membrane 18 and the distribution plate 22 are preferably made of silicon, so that etching and photolithographic techniques known from the art of semiconductor processing can be utilised for reliably and efficiently forming minute structures of these components, preferably from silicon wafers. While FIG. 1 shows only a single nozzle and actuator unit, it is possible and preferable that an entire chip comprising a plurality of nozzle and actuator units, or a plurality of such chips, are formed in parallel by wafer processing. The use of identical, respectively similar materials for the above components has the further advantage that problems resulting from differential thermal expansion of the components can be avoided or effectively minimized.

The flexible membrane 18 is securely bonded to the chamber plate 14 by means of an adhesive layer 26 so as to cover the pressure chamber 16 and to define a top wall thereof. An electrically conductive structure 28 is formed on the top surface of the membrane and may be led out on at least one side, so that it may be in electrical contact with a wire bond 30, for example.

The piezoelectric actuator 20 comprises a bottom electrode 32 held in intimate large-area contact with the electrically conductive structure 28, a top electrode 34, and a piezoelectric layer 36 sandwiched therebetween. The piezoelectric layer 36 may be made of a piezoelectric ceramic such as PZT (Lead Zirconate Titanate) and may optionally contain additional internal electrodes.

The peripheral edge of the top surface of the piezoelectric layer 36 as well as the lateral surfaces of that layer are covered by an insulating layer 38. The peripheral portion of the top electrode 34 is superposed on the insulating layer 38 and is led out to one side on the surface of the membrane 18, so that it may be in electrical contact with a wire bond 40.

At the locations where the electrical contacts, such as wirebonds 30 and 40, are made, the electrical leads are secured to the distribution plate 22 by means of another adhesive layer 42 that is also used to securely attach the top surface of the membrane 18 to the distribution plate.

It is observed that the bottom electrode 32 and preferably also the top electrode 34 of the actuator cover the entire surface of the piezoelectric layer 36, including the edge portions thereof, which contributes to an increase in power gain and volume displacement of the actuator. The insulating layer 38 reliably prevents the top and bottom electrodes from becoming short-circuited and also assures that the electrodes are separated everywhere by a sufficient distance, so that, when a voltage is applied to the electrodes, the strength of the electric field established therebetween will reliably be limited to a value that is not harmful to the piezoelectric material.

The distribution plate 22 is securely bonded to the top surface of the membrane 18 by means of adhesive layer 42 and defines a chamber 44 that accommodates the actuator 20 with sufficient play so as not to obstruct the piezoelectric deformation of the actuator. The actuator 20 will thus be shielded not only from the ink in the pressure chamber 16 and in the supply system but also from ambient air, so that a degradation of the actuator due to ageing of the piezoelectric material is minimized.

The chamber 44 may be filled with a gas such as nitrogen or argon that does not react with the piezoelectric material, or may be evacuated or held under a slight sub-atmospheric pressure. If, in another embodiment, the chamber 44 contains air at atmospheric pressure, it preferably communicates with the environment through a restricted vent hole, so that the pressure in the chamber may be balanced with the atmospheric pressure, but the exchange of air is restricted so as to avoid ageing of the piezo.

Above the actuator chamber 44 and separated therefrom, the distribution plate 22 defines a wide ink supply channel 46 that is connected, at at least one end thereof, to an ink reservoir (not shown). Optionally, the ink reservoir may be provided directly on top of the ink channel 46 in place of the cover plate 24.

In a position laterally offset from the actuator chamber 44, the distribution plate 22 defines a feedthrough 48 that connects the ink supply channel 46 to the pressure chamber 16 via a filter passage 50 formed by small perforations in the membrane 18. The filter passage 50 prevents impurities that may be contained in the ink from entering into the pressure chamber 16 and at the same time restricts the communication between the ink supply channel 46 and the pressure chamber 16 to such an extent that a pressure may be built up in the pressure chamber 16 by means of the actuator 20. To that end, the piezoelectric layer 36 of the actuator deforms in a flexural mode when a voltage is applied to the electrodes 32, 34.

When an ink droplet is to be expelled from the nozzle 12, the actuator is preferably energized with a first voltage having such a polarity that the piezoelectric layer 36 bulges away from the pressure chamber 16 and thus deflects the membrane 18 so as to increase the volume of the pressure chamber. As a result, ink will be sucked in through the filter passage 50. Then, the voltage is turned off, or a voltage pulse with opposite polarity is applied, so that the volume of the pressure chamber 16 is reduced again and a pressure wave is generated in the liquid ink contained in the pressure chamber. This pressure wave propagates to the nozzle 12 and causes the ejection of the ink droplet.

The above-described construction of the ink jet device, with the ink supply channel 46 being formed on top of the pressure chamber 16 (and on top of the actuator 20) has the advantage that it permits a compact configuration of a single nozzle and actuator unit and, consequently, permits a high integration density of a chip formed by a plurality of such units. As a result, a high nozzle density can be achieved for high resolution and high speed printing. Nevertheless, the device may be produced in a simple and efficient manufacturing process that is particularly suited for mass production. In particular, the electrical connections and, optionally, electrical components 52 can easily be formed at one side of the membrane 18 before the same is assembled with the distribution plate 22.

It will be understood that the metal layer forming the ground electrode 32 (or, alternatively, an electrode for energising the actuator) is led out in a position offset from the filter passage 50 in the direction normal to the plane of the drawing in FIG. 1 or is formed around that filter passage.

Figure 2:
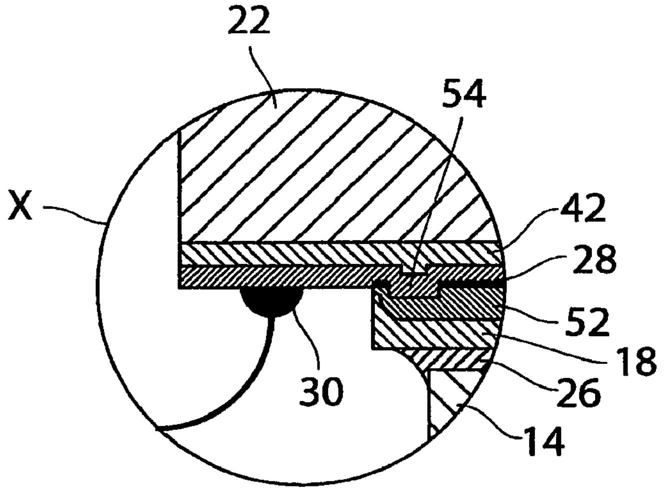
FIG. 2 is an enlarged detail of the device shown in FIG. 1.

FIG. 2 is an enlarged view of a detail that has been marked by a circle X in FIG. 1. In the example shown, part of an electronic component 52, e.g., a sensor or a switching transistor or driving circuit for controlling the actuator 20, has been embedded in the top surface of the membrane 18 by suitably doping the silicon material. Further, in that example, an extension or tab of the electrode 32 forms a reliable connection with the electronic component 52 through an opening 54 in a dielectric layer on the surface of the membrane.

Figure 3:
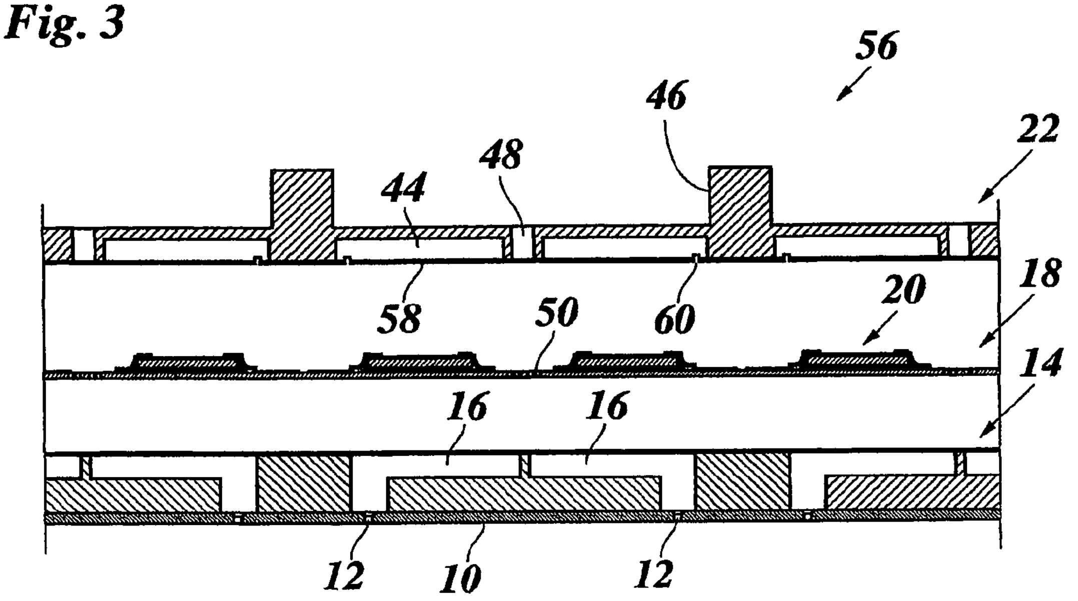
FIG. 3 is a partial sectional view of components of an ink jet device forming an array of a plurality of nozzle and actuator units.

FIG. 3 illustrates a chip 56 comprising a plurality of nozzle and actuator units that are constructed in accordance with the principles that have been described in conjunction with FIG. 1. Here, the main components of the chip, i.e., the chamber plate 14, the membrane 18 with the actuators 20, and the distribution plate 22, have been shown separated from one another for reasons of clarity.

In this example, the pressure chambers 16 are alternatingly arranged and rotation-symmetrically disposed, so that pairs of these chambers may be supplied with ink from a common channel 46 and a common feedthrough 48. The filter passages 50 for each pressure chamber 16 are arranged above an end portion of the respective pressure chamber 16 opposite to the end portion that is connected to the nozzle 12. This has the advantage that the pressure chambers may be flushed with ink so as to remove any air bubbles that might be contained therein and would be detrimental to the droplet generation process.

The chip 56 shown in FIG. 3 forms a two-dimensional array of nozzle and actuator units with a plurality of such units being aligned in the direction normal to the plane of the drawing in FIG. 3. In the example shown, each actuator 20 is accommodated in an individual chamber 44 that is separated from adjacent chambers by transverse walls 58 formed integrally with the distribution plate 22. As mentioned above, these chambers may communicate via restricted vent holes 60. As an alternative, the transverse walls 58 may be dispensed with, so that the actuators 20 aligned in a same column are accommodated in a common, continuous chamber 44.

Figure 4:
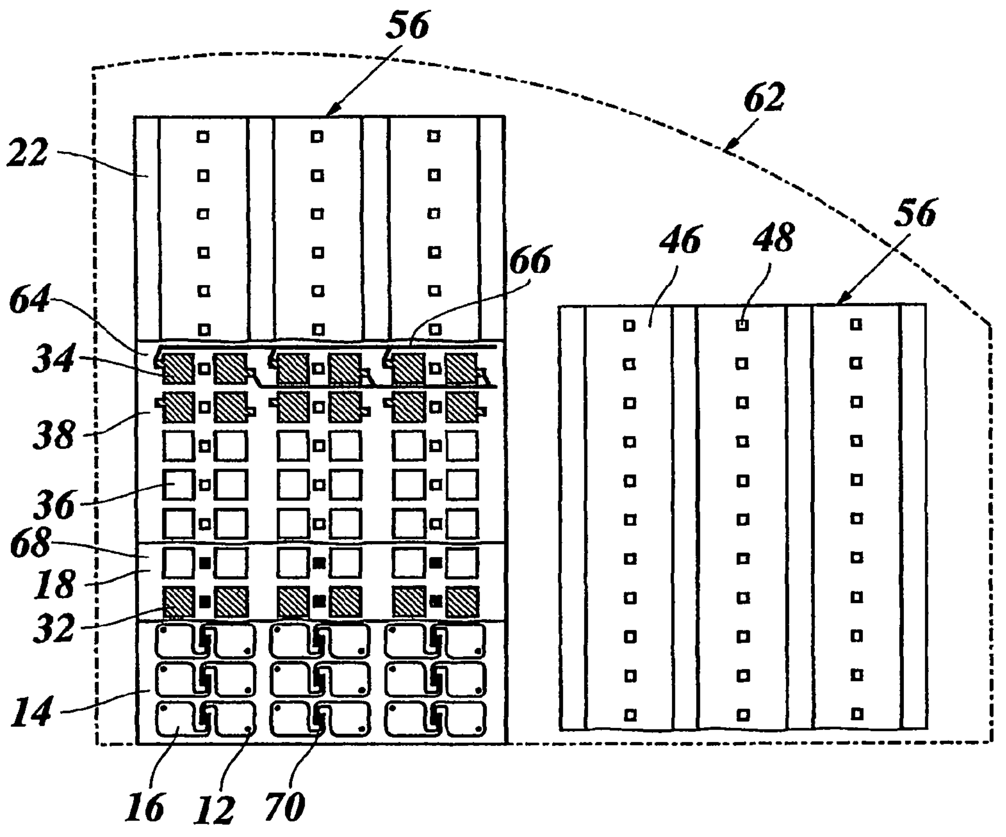
FIG. 4 is a partial plan view of arrays of the type shown in FIG. 3, as manufactured from a wafer.

Each of the membrane 18, the distribution plate 22, and, optionally, the chamber plate 14 may be formed by processing a respective wafer 62, as has been indicated in FIG. 4. The components of a plurality of chips 56 may be formed of a single wafer. What has been illustrated for the chip 56 shown on the right side in FIG. 4, is a top plan view of the distribution plate 22 with the ink supply channels 46 and feedthroughs 48. The chip on the left side in FIG. 4 has been shown partly broken away, so that the layer structure of the chip is visible.

A layer 64 directly underneath the distribution plate 22 shows five rows of actuators. The first two rows show top plan views of the top electrodes 34 with their projected leads. In this embodiment, the entire surface of the membrane 18, except the areas of the electrodes 34 and the areas coinciding with the feedthroughs 48, is covered by the insulating layer 38, as will later be explained in detail in conjunction with FIGS. 14 to 16. The first row in FIG. 4 shows also electrical tracks 66 connected to the leads and provided on the surface of the insulating layer 38. The last three rows in the layer 64 show the piezoelectric layers 36 without top electrodes.

In the next layer 68, the insulating layer 38 has been removed so that the membrane 18 with the filter passages 50 becomes visible. In the second row of this layer, the piezoelectric layers 36 have also been removed so as to illustrate the bottom electrodes 32.

The lowermost three rows of the chip show a top plan view of the chamber plate 14 with the pressure chambers 16 and the nozzles 12. In this example, the filter passages communicate with the pressure chambers 16 via labyrinths 70. These labyrinths serve to provide for a sufficient flow restriction. As shown, the pressure chambers 16 have an approximately square shape, and the labyrinth opens into the corner of the chamber that is diagonally opposite to the nozzle 12.

Preferred embodiments of the present method for producing the ink jet device and the chip 56, respectively, will now be described.

FIGS. 5 to 13 illustrate a method of forming the membrane 18 with the actuators 20.

Figure 5:
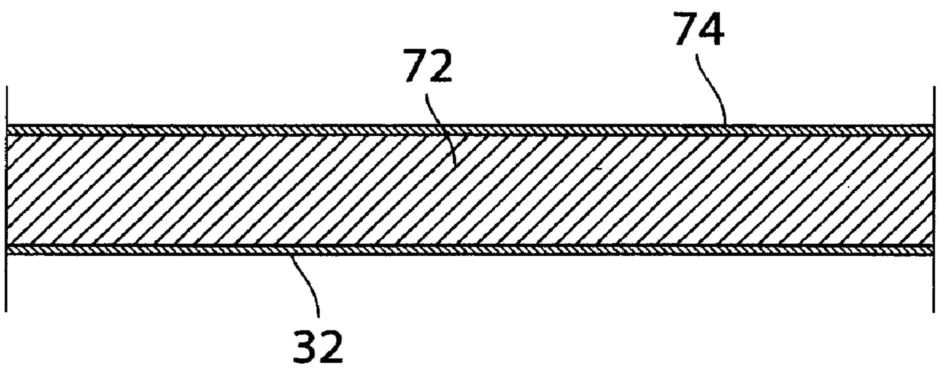
FIGS. 5-8 illustrate several steps of a method for preparing and mounting piezoelectric actuators on a membrane.

First, as is shown in FIG. 5, a slab 72 of piezoelectric material is prepared and is provided with the bottom electrode 32 and another electrode 74 on the top surface. These electrodes may be used for polarising the piezoelectric material.

The slab 72 should preferably have at least the size of an entire chip 56 which. If available, a slab of wafer size could be used, or a plurality of slabs may be attached with their electrodes 74 to a wafer-size carrier plate. The thickness of the slab 72 may for example be in the range from 200 to 500 μm.

Figure 6:
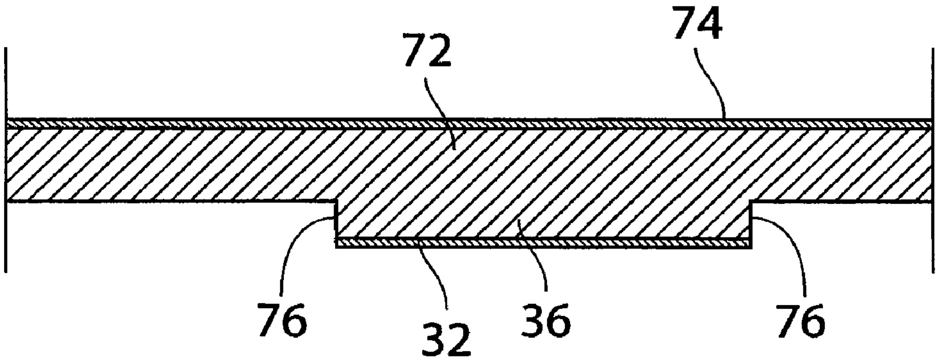

As is shown in FIG. 6, grooves 76 are cut into the bottom side of the slab 72 to a depth slightly larger than the intended thickness of the piezoelectric layer 36 of the actuator. Although not shown in the drawings, the grooves 76 extend cross-wise, thus leaving projecting platforms that will later form the piezoelectric layers 36 covered by the bottom electrodes 32. The pattern of these platforms corresponds to the intended array of actuators on the chip 56.

Figure 7A:
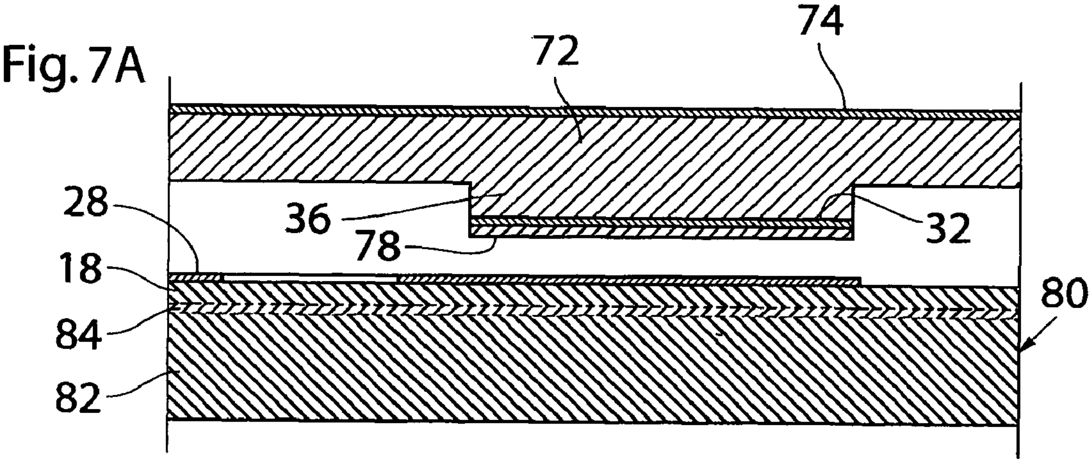
Figure 7B:
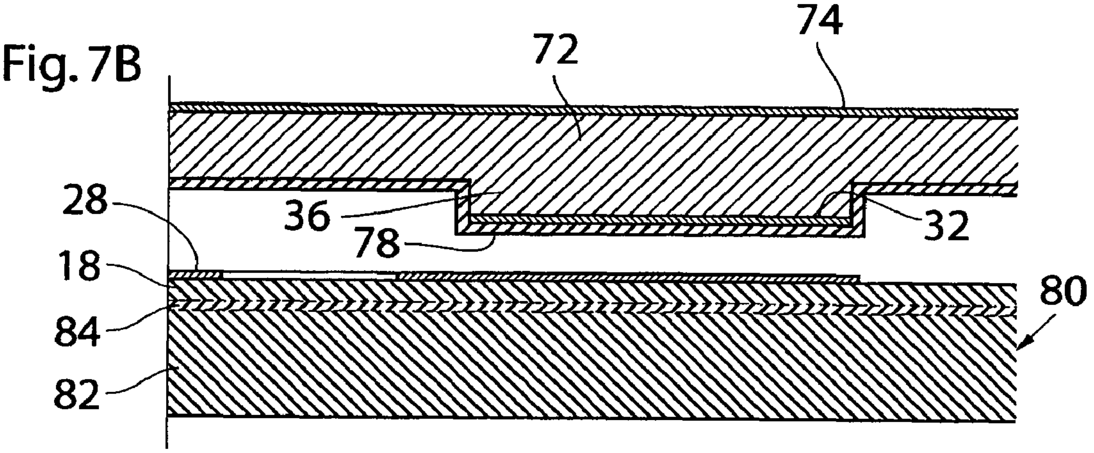

As is shown in FIG. 7A, the bottom side of the bottom electrode 32 is covered with an adhesive layer 78, e.g., by tampon printing, roller coating or the like. Alternatively, as is shown in FIG. 7B, the entire bottom side of the slab 72 may be covered with an insulating adhesive layer 78 by spray coating. An advantage thereof is that the side faces of the piezoelectric layer 36 are already covered with an insulating layer.

Further, a wafer-size carrier plate 80 is prepared, and the electrically conductive structure 28 is formed with a suitable pattern on the top surface thereof. The carrier plate 18 is preferably formed by an SOI wafer having a top silicon layer which will later form the membrane 18, a bottom silicon layer 82 that will later be etched away, and a silicon dioxide layer 84 separating the two silicon layers and serving as an etch stop.

In a practical embodiment, the top silicon layer and hence the membrane 18 may have a thickness between 1 μm and 25 μm, or about 10 μm, the etch stop has a thickness of 0.1 to 2 μm and the bottom silicon layer 82 may have a thickness of between 150 and 1000 μm, so that a high mechanical stability is assured.

The slab 72 is then pressed against the top surface of the carrier plate 80, and the bottom electrodes 32 of the intended actuators are firmly bonded to the conductive structures 28 by thermocompression bonding. In this process, as has been shown in FIG. 8, the adhesive layer 78 will be squeezed out and will form a meniscus around the periphery of each piezoelectric layer 36, while the conductive structures 28 and electrodes 32 are brought into electrical contact with one another. Since the piezoelectric material of the slab 72 will typically have pyroelectric properties, it is convenient to short-circuit the electrodes 32 and 74 during the thermocompression bonding process in order to avoid electrical damage. Alternatively instead of thermocompression bonding ultrasonic bonding may be used where instead of an adhesive layer a gold layer or gold bumps are provided on the bottom electrodes of the intended actuators and/or on the ground electrodes.

Figure 8:
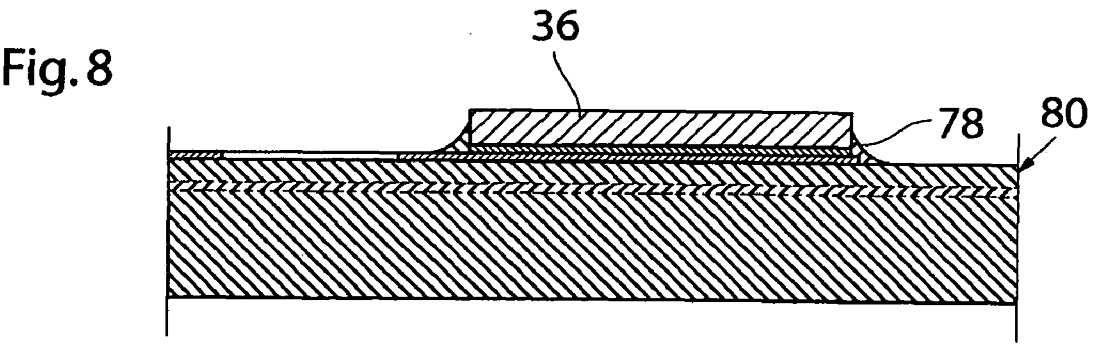

As is shown in FIG. 8, the electrode 74 and the continuous top portion of the slab 72 are removed, e.g., by grinding, so that only the desired array of piezoelectric layers 36 of the actuators is left on the carrier plate 80.

Figure 9:
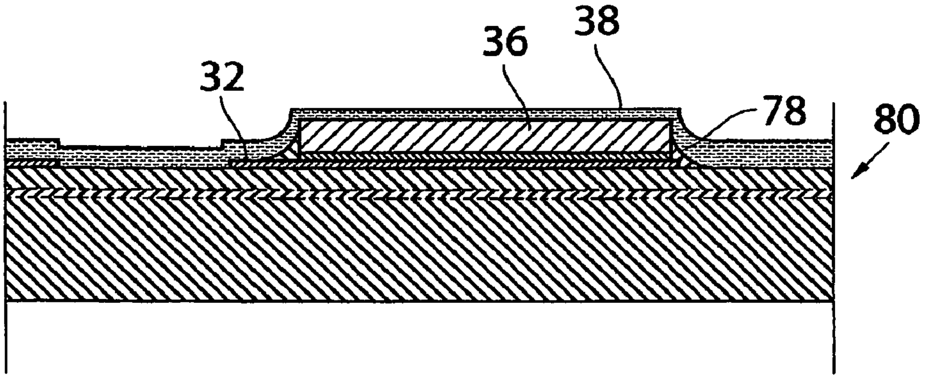
FIGS. 9-11 illustrate several steps of a method for completing the actuators on the membrane.

As is shown in FIG. 9, the next step is to form the insulating layer 38. This layer is formed, e.g., by spin coating, spray coating, sputtering PVD, CVD or the like, at least on the entire surface of the piezoelectric layer 36, on the side walls thereof and on the meniscus formed by the adhesive layer 78, respectively. The insulating layer 38 is preferably formed by a photo-curable epoxy resin such as SU8 or BCB. The portions of the layer 38 that are to be retained are exposed with light so as to cure the resin, and the non-exposed portions are removed.

Figure 10:
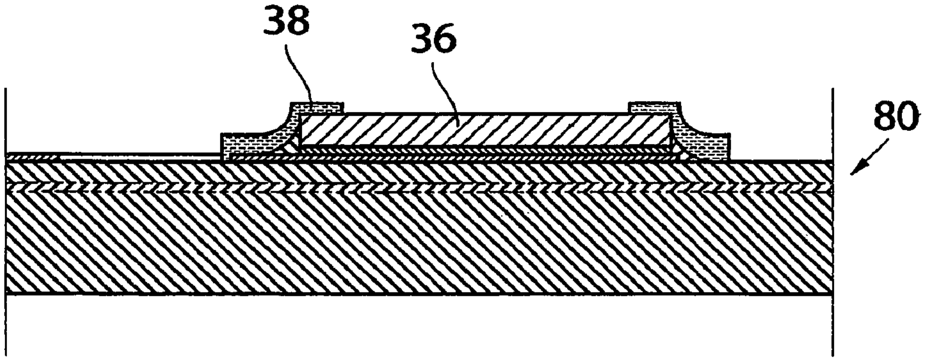

As is shown in FIG. 10, the layer 38 is removed at least from the central portion of the insulating layer 36 where the top electrode 34 is to be applied.

Figure 11:
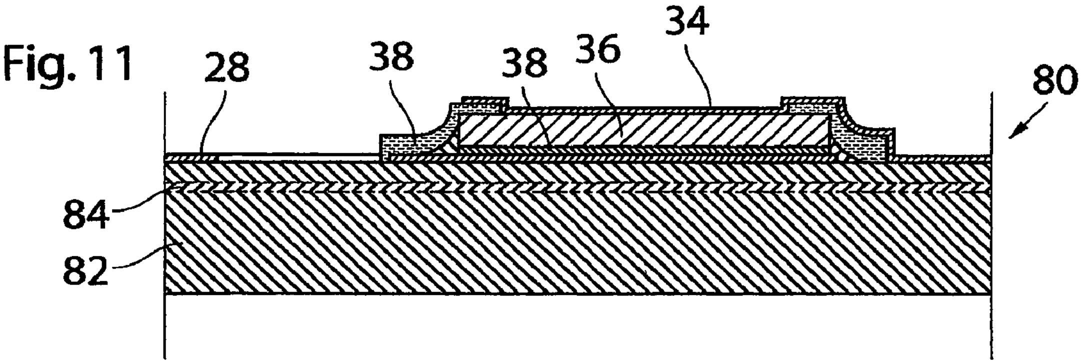

As is shown in FIG. 11, the top electrode 34 is formed on the exposed top surface of the piezoelectric layer 36, e.g., by sputtering or any other suitable process. In order to be able to electrically contact the top electrode, this electrode is extended on at least one side over the insulating layer 38 and onto the top surface of the carrier plate 80, as is shown on the right side in FIG. 11. The insulating layer 38 assures that the metal of the top electrode 34 is reliably kept away, by a sufficient distance, from the bottom electrode 32 and the conductive structures 28, so as to avoid short circuits and to limit the strength of the electric field developed between the electrodes.

The step shown in FIG. 11 completes the formation of the piezoelectric actuators 20.

Figure 12:
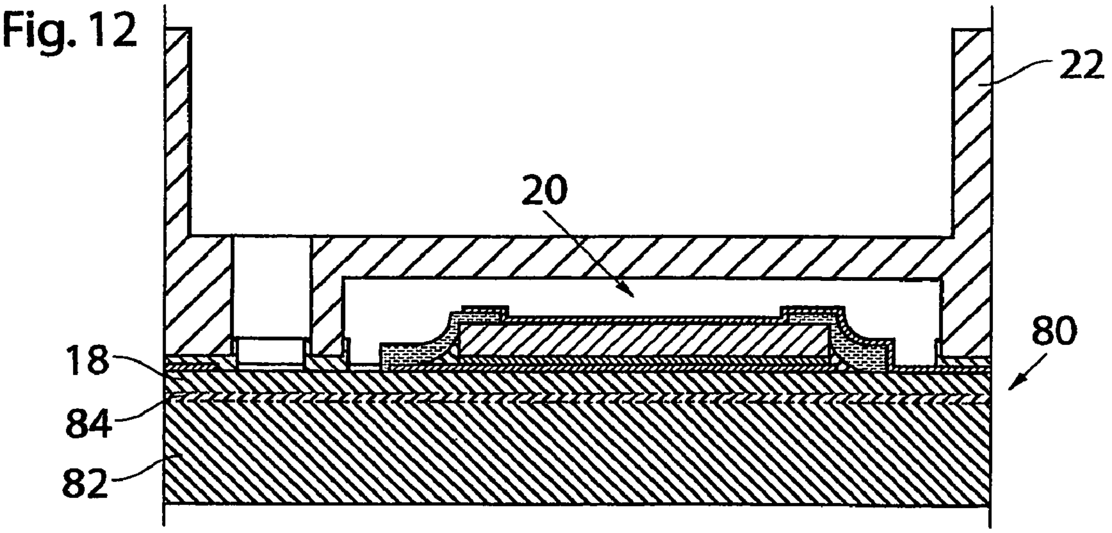
FIG. 12 illustrates the step of attaching the membrane to a rigid substrate.

In the next step, shown in FIG. 12, the distribution plate 22 is bonded to the top surface of the carrier plate 80. The distribution plate 22 will be prepared separartely by etching a suitable silicon wafer. For example, the relatively coarse structures of the supply channels 46 may be formed in a cost-efficient anisotropic wet etching process, whereas the minute structures of the actuator chambers 44 and feedthroughs 48 may be formed by dry etching from below.

The distribution plate 22 then serves as a rigid substrate that can be used as a handle for manipulating the assembly. The joint wafers forming the distribution plate 22 and the carrier plate 80 are transferred to an etching stage where the lower silicon layer 82 of the carrier plate 80 is etched away up to the etch stop formed by the silicon oxide layer 84. The silicon oxide layer is subsequently removed, which leaves only the thin, flexible membrane 18 with the actuators 20 mounted thereon and firmly secured to the rigid distribution plate 22.

Figure 13:
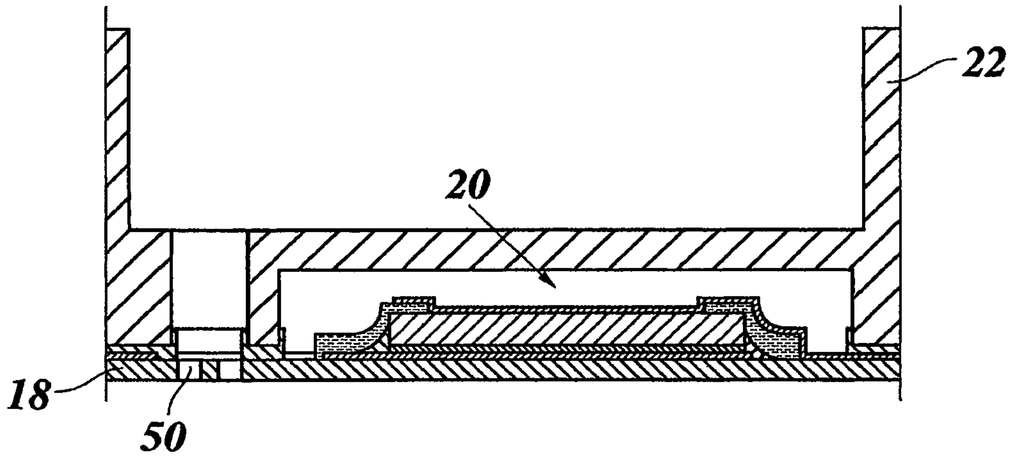
FIG. 13 illustrates the step of releasing the membrane.

The filter passages 50 may be formed in the same or is a separate etching step or by another process such as laser cutting. The result is shown in FIG. 13. Since the flexible membrane 18 is backed by the distribution plate 22, it may safely be handled in the further processing steps which include bonding the membrane 18 to the chamber plate 14. If, in this stage, the assembly of the membrane 18 and the distribution plate 22 on the one side and the chamber plate 14 on the other side have wafer size, the actuators 20 and filter passages 50 may accurately be aligned with the pressure chambers 16 for all the chips on the wafers in the single alignment step. Finally, the joint wafers will be diced to form the individual chips 56.

As an alternative, it is of course possible to dice only the joint wafers forming the membrane 18 and the distribution plate 22 and to assemble them with the separate chamber plates 14.

In the example shown in FIGS. 9-13, the insulating layer 38 has a relatively small thickness on the top side of the piezoelectric layer 36 and a larger thickness on the surface of the membrane and the electrically conductive structures 28, respectively. For comparison, FIG. 1 illustrates an embodiment where the insulating layer 38 has a uniform thickness.

Figure 14:
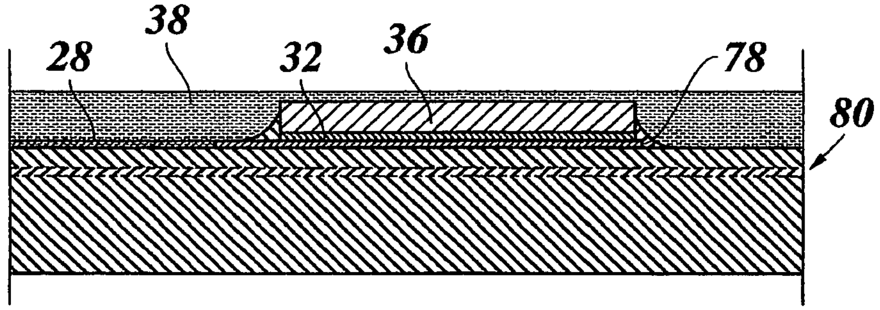
FIGS. 14-16 illustrate steps analogous to FIGS. 9-11 for a modified embodiment of the present invention.

FIG. 14 illustrates yet another embodiment, wherein the step of FIG. 9 is modified in that the insulating layer 38 is formed on the entire surface of the carrier plate 80 with a flat, continuous top surface, i.e., the piezoelectric layers 36, the bottom electrodes 32, and the electrically conductive structures 28 are entirely buried in the insulating layer 38. This embodiment corresponds to the example shown in FIG. 4.

Figure 15:
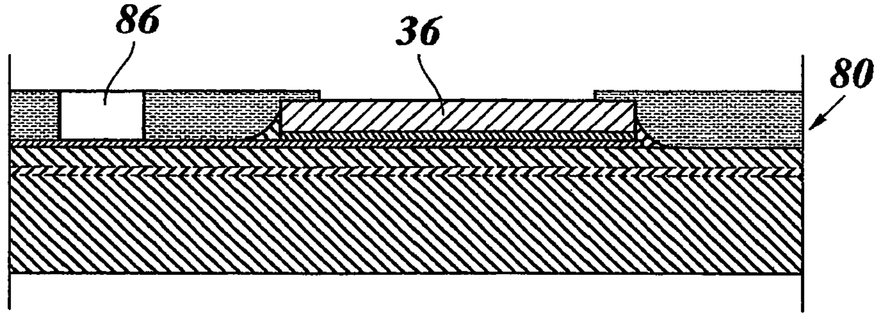

Again, as is shown in FIG. 15, the photo-curable insulating layer 38 is exposed, and the resin is removed at least in the portions covering the piezoelectric layers 36 and portions 86 coinciding with the feedthroughs 48.

Figure 16:
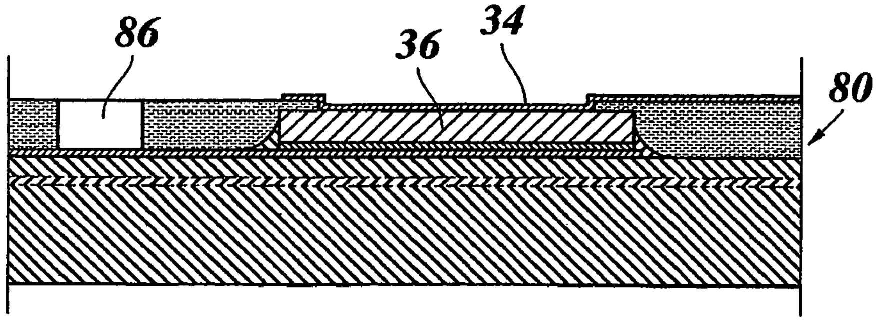

Finally, as is shown in FIG. 16, the top electrodes 34 of the actuators are applied and extended on the flat top surface of the insulating layer 38. Depending on the procedures employed for electrically contacting the actuators, this may facilitate the formation of the electrical contacts. The rest of the procedure corresponds to the one that has been explained in conjunction with FIGS. 9 to 12.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An ink jet device comprising at least one piezoelectric actuator, said piezoelectric actuator comprising:
- a piezoelectric layer provided with a top surface and a bottom surface,
- a top electrode formed on said top surface and a bottom electrode extending over the entire bottom surface of said piezoelectric layer, said bottom electrode being attached to a membrane, wherein
- at least a peripheral portion of said top surface of the piezoelectric layer as well as the side faces of the piezoelectric layer are covered with an insulating material, and said top electrode is superimposed on said insulating material covering said peripheral portion of the piezoelectric layer.

2. The ink jet according to claim 1, wherein the insulating layer has a uniform thickness.

3. The ink jet device according to claim 1, wherein a portion of the insulating layer covers the membrane.

4. The ink jet according to claim 3, wherein the thickness of the insulating layer is larger in the portions covering the membrane than in the portions covering the top surface of the piezoelectric layer.

5. The ink jet according to claim 4, wherein the thickness of the insulating layer in the portions covering the membrane is larger than the thickness of the insulating layer, so that the insulating layer has a continuous flat top surface on both, the peripheral portions of the piezoelectric layer and the surrounding portions of the membrane.

6. The ink jet according to claim 1, wherein the piezoelectric actuator further comprises an adhesive attaching a bottom surface of said bottom electrode to the membrane, the adhesive further being in contact with and surrounding a lateral peripheral sidewall of said bottom electrode.

7. The ink jet according to claim 6, wherein the adhesive covers the entire lateral peripheral sidewall of said bottom electrode.

8. The ink jet according to claim 6, wherein the adhesive surrounding the lateral peripheral sidewall of said bottom electrode is fully covered by the insulating material.

9. The ink jet according to claim 6, wherein the adhesive is in contact with and surrounds a lateral peripheral sidewall of said piezoelectric layer.

10. The ink jet according to claim 9, wherein the adhesive forms a meniscus surrounding the lateral peripheral sidewall of said bottom electrode and the lateral peripheral sidewall of said piezoelectric layer.

11. The ink jet according to claim 1, wherein the insulating layer is formed by a radiation-curable resin.

12. The ink jet according to claim 1, wherein the top surface of the membrane carries an electrode which contacts the bottom electrode of the actuator, and wherein the insulating layer covers part of that electrode on the membrane.

13. The method of producing the piezoelectric actuator of claim 1, comprising the steps of:
- securing the bottom electrode and the piezoelectric layer on the surface of the membrane,
- forming a ring of insulating layer at least on the peripheral edge portion of the top surface of the piezoelectric layer and on the side surface of said layer, and
- forming the top electrode on the top surface of the piezoelectric layer so as to superpose portions of the insulating layer.

14. The method according to claim 13, wherein the insulating layer is formed by a radiation curable resin, comprising the steps of:
- forming the insulating layer to cover the entire surface of the piezoelectric layer,
- curing the insulating layer in the portions covering the peripheral edge of the piezoelectric layer and the surrounding portion of the membrane by exposing the same to radiation, and
- removing the parts of the insulating layer that have not been exposed.

15. The method according to claim 14, wherein the top electrode is formed to extend beyond the periphery of the piezoelectric layer, so as to form an electrical contact for the1 top electrode.

16. The method of forming an array of piezoelectric actuators on a common chip according to claim 13, wherein the process steps of forming the insulating layer, exposing the same and forming the top electrode, are performed simultaneously for all actuators of the array.

17. The method according to claim 16, wherein the piezoelectric layers of all the actuators of the array are obtained from a common slab by cutting grooves into the side of the slab that is provided with the bottom electrode, bonding the slab to the membrane, and removing a continuous top layer of the slab to separate the piezoelectric layers from one another.

18. The method according to any of the claim 13, wherein the piezoelectric layer provided with the bottom electrode is attached to the membrane by means of an adhesive.

19. The method according to claim 13, wherein the piezoelectric layer provided with the bottom electrode is attached to the membrane by thermocompression bonding.

* * * * *